United States Patent
Yamaguchi et al.

(10) Patent No.: US 8,912,126 B2
(45) Date of Patent: Dec. 16, 2014

(54) SUBSTRATE, METHOD OF PRODUCING SUBSTRATE, SUPERCONDUCTING WIRE, AND METHOD OF PRODUCING SUPERCONDUCTING WIRE

(75) Inventors: Takashi Yamaguchi, Osaka (JP); Masaya Konishi, Osaka (JP); Hajime Ota, Osaka (JP)

(73) Assignees: Sumitomo Electric Industries, Ltd., Osaka-shi, Osaka (JP); Toyo Kohan Co., Ltd., Tokyo (JP)

( * ) Notice: Subject to any disclaimer, the term of this patent is extended or adjusted under 35 U.S.C. 154(b) by 342 days.

(21) Appl. No.: 13/381,109

(22) PCT Filed: Jul. 7, 2010

(86) PCT No.: PCT/JP2010/061540
§ 371 (c)(1),
(2), (4) Date: Dec. 28, 2011

(87) PCT Pub. No.: WO2011/004842
PCT Pub. Date: Jan. 13, 2011

(65) Prior Publication Data
US 2012/0108436 A1    May 3, 2012

(30) Foreign Application Priority Data
Jul. 10, 2009  (JP) ................. 2009-163514

(51) Int. Cl.
*H01B 12/06* (2006.01)
*H01L 39/24* (2006.01)
*H01B 13/00* (2006.01)
*B32B 15/20* (2006.01)
*C30B 23/02* (2006.01)
*C23C 28/00* (2006.01)

(52) U.S. Cl.
CPC ............ *H01B 12/06* (2013.01); *H01L 39/2461* (2013.01); *Y02E 40/642* (2013.01)
USPC ........... 505/239; 505/237; 505/238; 505/430; 505/470; 505/472; 174/125.1; 428/674; 428/610; 428/472; 205/271

(58) Field of Classification Search
CPC ..... H01L 39/24; H01L 39/126; H01L 39/143; H01L 39/2419; H01L 39/2425; H01L 39/2454; H01L 39/2458; H01L 39/2461; H01B 12/06; C25D 3/12; C30B 23/025; C30B 25/025; B32B 15/01; B32B 15/015; C23C 18/32; C23C 18/34; C23C 18/54; C23C 14/087; C04B 35/50; C04B 35/505; B23K 20/00; B23K 20/04; C22F 1/08; C22C 9/00
USPC ......... 505/100, 150, 236–239, 430, 434, 470, 505/472, 473, 704, 818; 428/610, 674, 675, 428/680, 457, 469, 472, 701, 702; 427/62, 427/383.7, 435, 436, 437, 438, 595, 596, 427/597; 174/125.1; 29/599; 205/261, 271, 205/291; 148/435, 518
See application file for complete search history.

(56) References Cited

U.S. PATENT DOCUMENTS

| | | |
|---|---|---|
| 2004/0033904 A1* | 2/2004 | Moore et al. .................. 505/100 |
| 2009/0053550 A1 | 2/2009 | Kashima et al. |
| 2009/0069187 A1 | 3/2009 | Hasegawa et al. |
| 2009/0286686 A1 | 11/2009 | Teranishi et al. |

FOREIGN PATENT DOCUMENTS

| | | |
|---|---|---|
| JP | 2005-1935 | 1/2005 |
| JP | 2006-127847 | 5/2006 |
| JP | 2007-165153 | 6/2007 |
| JP | 2007-188756 | 7/2007 |
| JP | 2009-46734 | 3/2009 |

OTHER PUBLICATIONS

Yu et al. "New Cu-Ni Substrate for Coated Conductors," Materials Science Forum, 2007, V546-549, pp. 1877-1880.*
Zhou et al, "The Manufacturing of an eletroplated Ni layer over textured Cu-substrate for Cu-based HTS Coated Conductors," Superconduct. Sci. Technol 2005, V18, pp. 107-111.*

* cited by examiner

Primary Examiner — Stanley Silverman
Assistant Examiner — Kallambella Vijayakumar
(74) Attorney, Agent, or Firm — Drinker Biddle & Reath LLP

(57) ABSTRACT

A substrate of the present invention includes a copper layer, an alloy layer containing copper and nickel, formed on the copper layer, a nickel layer formed on the alloy layer, and an intermediate layer formed on the nickel layer. The concentration of nickel in the alloy layer at the interface between the alloy layer and the nickel layer is greater than the concentration of nickel in the alloy layer at the interface between the alloy layer and the copper layer. According to the present invention, there can be provided a substrate that allows the AC loss of a superconducting wire to be reduced, a method of producing a substrate, a superconducting wire, and a method of producing a superconducting wire.

8 Claims, 3 Drawing Sheets

(a)

(b)

(c)

(d)

(e)

(a)

(b)

SUBSTRATE, METHOD OF PRODUCING SUBSTRATE, SUPERCONDUCTING WIRE, AND METHOD OF PRODUCING SUPERCONDUCTING WIRE

TECHNICAL FIELD

The present invention relates to a substrate, a method of producing a substrate, a superconducting wire, and a method of producing a superconducting wire.

BACKGROUND ART

Since the discovery of high-temperature superconductors, development in high-temperature superconducting wire is carried out actively in view of the application to power apparatus such as a cable, magnet, current-limiting device, and the like. The high-temperature superconducting wire is roughly classified into two types, i.e. a bismuth type silver sheath wire and a RE123 type thin film wire (RE=rare earth element).

The RE123 type thin film superconducting wire has raised hopes for a high-temperature superconducting wire of the next generation based on the advantages of: (1) the critical current density at the liquid nitrogen temperature (77.3K) exhibits the performance of approximately $10^6$ A/cm$^2$ that is two orders of magnitude greater as compared with the bismuth type silver sheath wire; and (2) the critical current density under magnetic field is high.

As a general structure of a thin film superconducting wire, a thin intermediate layer of ceramic is formed on a metal substrate, and a superconducting layer is formed thereon. In order to draw out superior superconducting properties for a thin film superconducting wire, the crystal orientation of the superconducting layer must be arranged in three dimensions. To this end, a thin film having high orientation must be produced for the aforementioned thin film intermediate layer.

Japanese Patent Laying-Open No. 2005-1935 (Patent Literature 1) discloses a method including the steps of removing an oxide layer located on the surface of an oriented metal substrate, and epitaxial growth of a thin film such as an intermediate layer and a superconducting layer while maintaining the biaxial orientation of the oriented metal substrate.

CITATION LIST

Patent Literature

PTL 1: Japanese Patent Laying-Open No. 2005-1935

SUMMARY OF INVENTION

Technical Problem

When a superconducting wire is produced using a ferromagnetic body such as Ni for an oriented metal substrate, as disclosed in Patent Literature 1, and current is conducted to the obtained superconducting wire, there was a problem that the saturation magnetization of the substrate is great and the AC loss caused by hysteresis loss is increased.

Therefore, an object of the present invention is to provide a substrate that allows the AC loss of a superconducting wire to be reduced, a method of producing a substrate, a superconducting wire, and a method of producing a superconducting wire.

Solution to Problem

A substrate of the present invention includes a copper layer, an alloy layer containing copper and nickel, formed on the copper layer, a nickel layer formed on the alloy layer, and an intermediate layer formed on the nickel layer. The concentration of nickel in the alloy layer at the interface between the alloy layer and the nickel layer is greater than the concentration of nickel in the alloy layer at the interface between the alloy layer and the copper layer.

Preferably in the substrate of the present invention, the concentration of nickel in the alloy layer is monotonically decreased from the interface between the alloy layer and the nickel layer towards the interface between the alloy layer and the copper layer.

A method of producing a substrate of the present invention includes the steps of: preparing a substrate having a nickel layer formed on a copper layer through plating, alloying a portion of the nickel layer while leaving a remaining portion of the nickel layer; and epitaxial-growing an intermediate layer on the nickel layer after the step of alloying the nickel layer.

A superconducting wire of the present invention includes a copper layer, an alloy layer containing copper and nickel, formed on the copper layer, a nickel layer formed on the alloy layer, an intermediate layer formed on the nickel layer, and a superconducting layer formed on the intermediate layer. The concentration of nickel in the alloy layer at the interface between the alloy layer and the nickel layer is greater than the concentration of nickel in the alloy layer at the interface between the alloy layer and the copper layer.

Preferably in the superconducting wire of the present invention, the concentration of nickel in the alloy layer is monotonically decreased from the interface between the alloy layer and the nickel layer towards the interface between the alloy layer and the copper layer.

A method of producing a superconducting wire of the present invention includes the steps of: preparing a substrate having a nickel layer formed on a copper layer through plating, alloying a portion of the nickel layer while leaving a remaining portion of the nickel layer; epitaxial-growing an intermediate layer on the nickel layer after the step of alloying the nickel layer, and forming a superconducting layer on the intermediate layer.

According to a substrate, a method of producing a substrate, a superconducting wire, and a method of producing a superconducting wire of the present invention, some of the nickel in the substrate is alloyed to be rendered non-magnetic. Accordingly, the hysteresis loss at the substrate is decreased, allowing the AC loss of the superconducting wire to be reduced.

Preferably in the method of producing a substrate of the present invention, the step of alloying the nickel layer is carried out under reduced pressure absent of hydrogen gas.

Preferably in the method of producing a superconducting wire of the present invention, the step of alloying the nickel layer is carried out under reduced pressure absent of hydrogen gas.

By carrying out the step of alloying the nickel layer under reduced pressure absent of hydrogen gas, the oxide layer at the Ni surface is left until just before formation of the intermediate layer, and reduced during formation of the intermediate layer. Accordingly, Ni having favorable matching lattice with the intermediate layer is exposed at the surface while $H_2O$ is present in the proximity of the substrate. Therefore, oxygen loss of the metal oxide that is the intermediate layer can be prevented to facilitate orientation.

Advantageous Effect of Invention

According to the present invention, a substrate and a superconducting wire that can reduce AC loss of the superconducting wire can be obtained.

DESCRIPTION OF EMBODIMENTS

Figure 1:
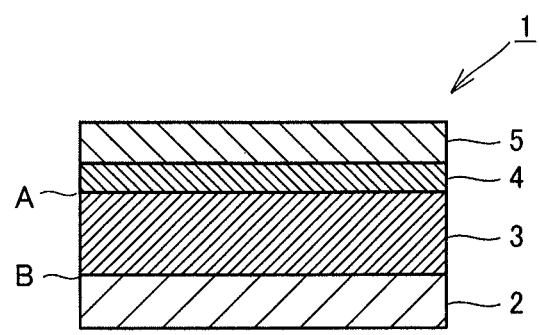
FIG. 1 is a schematic sectional view of a substrate according to an embodiment of the present invention.

Embodiments of the present invention will be described hereinafter with reference to the drawings. In the drawings, the same or corresponding elements have the same reference characters allotted, and description thereof will not be repeated.

First Embodiment

Substrate

FIG. 1 is a schematic sectional view of a substrate 1 according to an embodiment of the present invention. Referring to FIG. 1, substrate 1 according to an embodiment of the present invention includes a copper layer (hereinafter, also referred to as "Cu layer") 2, an alloy layer 3 containing copper and nickel, formed on copper layer 2, a nickel layer 4 (hereinafter, also referred to as "Ni layer") formed on alloy layer 3, and an intermediate layer 5 formed on nickel layer 4.

Substrate 1 may take the shape of a relatively lengthy tape.

(Copper Layer)

Cu layer 2 is suitable for an oriented substrate since Cu atoms are in biaxial orientation. A "biaxial orientation" includes, not only a complete biaxial orientation, but also the case where the angle of deviation of the crystal axis is less than or equal to 25°. Moreover, the orientation direction preferably corresponds to the case where the <100> axis is in a direction perpendicular to the substrate face and the <010> axis is in the direction of the length of the substrate.

Cu layer 2 can also be stacked on another metal or alloy. For example, Cu layer 2 can be provided on stainless steel that is a material of high strength (hereinafter, also referred to as SUS).

Cu layer 2 may take the shape of a relatively lengthy tape. The thickness of Cu layer 2 is 15 to 18 μm, for example.

(Alloy Layer)

Alloy layer 3 is a non-magnetic metal containing nickel and copper. Preferably, alloy layer 3 is oriented.

The saturation magnetization of alloy layer 3 is smaller than the saturation magnetization of simple Ni. Namely, there is the case where the flux density is 0 T, and the case where the flux density exceeds 0 T and is lower than the flux density of simple Ni.

The magnetism of alloy layer 3 is smaller than the magnetism of simple Ni. Namely, there is the case where the maximum energy (BHmax) is 0 J/m$^3$, and the case where the maximum energy exceeds 0 J/m$^3$ and is smaller than the maximum energy of simple Ni.

Alloy layer 3 has an Ni concentration distribution. Specifically, the concentration of nickel in the alloy layer at the interface between the alloy layer and the nickel layer indicated by A in FIGS. 1 and 2 is greater than the concentration of nickel in the alloy layer at the interface between the alloy layer and the copper layer indicated by B in FIGS. 1 and 2.

Figure 2:
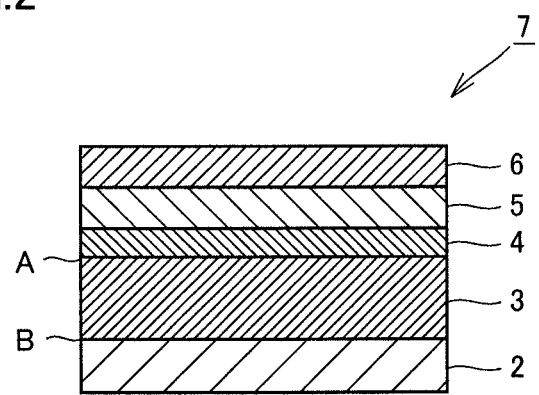
FIG. 2 is a schematic sectional view of a superconducting wire according to an embodiment of the present invention.

In alloy layer 3, the concentration of Ni in alloy layer 3 is preferably monotonically decreasing from the interface between alloy layer 3 and Ni layer 4 indicated by A in FIGS. 1 and 2 towards the interface between alloy layer 3 and Cu layer 2 indicated by B in FIGS. 1 and 2.

Figure 4:
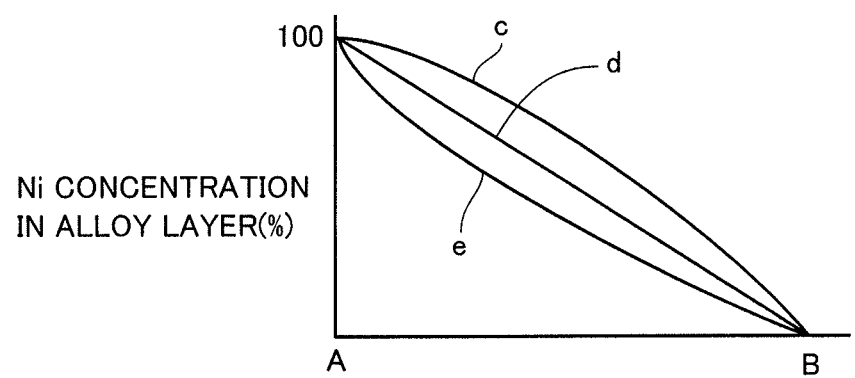
FIG. 4 is a graph representing the nickel concentration in an alloy layer of a substrate or superconducting wire according to an embodiment of the present invention.
Figure 4:
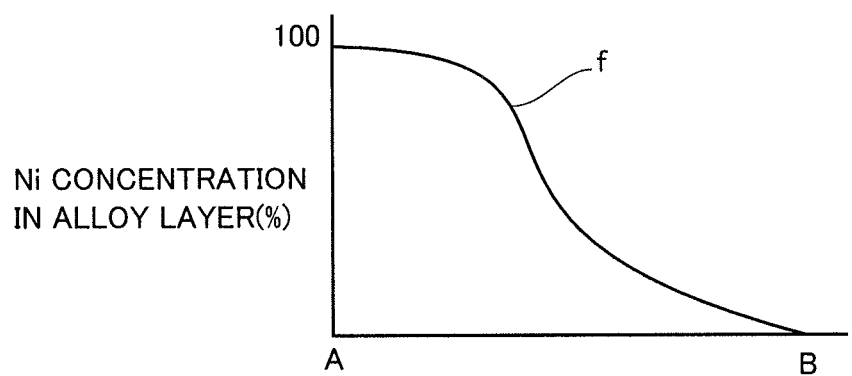

Monotonic decrease will be described with reference to FIG. 4. In FIG. 4 (a) representing an example of monotonic decrease, the Ni concentration in alloy layer 3 always decreases from the interface between alloy layer 3 and Ni layer 4 indicated by A towards the interface between alloy layer 3 and Cu layer 2 indicated by B, as shown in c, d and e. Referring to FIG. 4 (b) representing another example of monotonic decrease, the concentration of Ni in alloy layer 3 is the same or decreases from the interface between alloy layer 3 and Ni layer 4 indicated by A towards the interface between alloy layer 3 and Cu layer 2 indicated by B, as shown by f. In other words, "monotonic decrease" means that any region where the Ni concentration increases from the interface between alloy layer 3 and Ni layer 4 indicated by A towards the interface between alloy layer 3 and Cu layer 2 indicated by B is not included.

Alloy layer 3 has a thickness of 1.0 to 2.1 μm, for example.

(Nickel Layer)

Ni layer 4 serves to prevent oxidation during formation of intermediate layer 5. In the case where Cu layer 2 is oriented, Ni layer 4 is also oriented.

Ni layer 4 preferably has a thickness of 0.3 to 1.5 μm.

(Intermediate Layer)

Intermediate layer 5 serves to have superconducting layer 6 formed on its surface. Intermediate layer 5 is formed of one or more layers. In the case where intermediate layer 5 is formed of a plurality of layers, each layer constituting intermediate layer 5 may be made of a substance differing from each other.

For intermediate layer 5, a metal oxide having at least one type of metal element with a crystal structure of the pyrochloreu, fluorite, rock salt or perovskite type is adopted. Specifically, rare earth element oxide such as $CeO_2$, YSZ (Yttria Stabilized Zirconia), BZO ($BaZrO_3$), STO ($SrTiO_3$), $Al_2O_3$, $YAlO_3$, MgO, Ln-M—O based compound (Ln is one or more type of lanthanoid element, M is one or more type of element selected from Sr, Zr and Ga, and O is oxygen) can be cited. Such oxide serves to alleviate the difference in the crystal constant and crystal orientation between Cu layer 2 that is the oriented metal substrate and superconducting layer 6 formed on intermediate layer 5, and prevents the flow out of metal atoms from Cu layer 2 towards superconducting layer 6. $CeO_2$, for example, can be cited for such a material.

Second Embodiment

Superconducting Wire

FIG. 2 is a schematic sectional view of superconducting wire 7 according to an embodiment of the present invention. Referring to FIG. 2, superconducting wire 7 according to an embodiment of the present invention includes a copper layer 2, an alloy layer 3 containing copper and nickel, formed on copper layer 2, a nickel layer 4 formed on alloy layer 3, an intermediate layer 5 formed on nickel layer 4, and a superconducting layer 6 formed on intermediate layer 5.

Superconducting wire 7 may have the shape of a relatively lengthy tape.

Copper layer 2, alloy layer 3, nickel layer 4, and intermediate layer 5 in superconducting wire 7 are similar to those adopted for substrate 1.

(Superconducting Layer)

Superconducting layer 6 has the shape of a relatively lengthy tape. Superconducting layer 6 is a superconductor or the like represented by $REBa_2Cu_3O_y$ (y is 6-8, more preferably substantially 7; RE implies a rare earth element such as Y (yttrium), or Gd (gadolinium), Sm (samarium), Ho (holmium)). Preferably, superconducting layer 6 is formed of GdBCO, for example. GdBCO is represented as $GdBa_2Cu_3O_y$ (y is 6-8, more preferably substantially 7).

Superconducting wire 7 may further include a protection layer (not shown) formed on superconducting layer 6. The protection layer protects superconducting layer 6, and is the contact region with an external electrode. The protection layer is not particularly limited as long as it has high conductivity. Preferably, Ag, Au, Pt, Al, or an alloy thereof is adopted.

Third Embodiment

Method of Producing Substrate

Figure 3:
FIG. 3 is a schematic sectional view to describe a method of producing a substrate and a superconducting wire according to an embodiment of the present invention.
Figure 3:
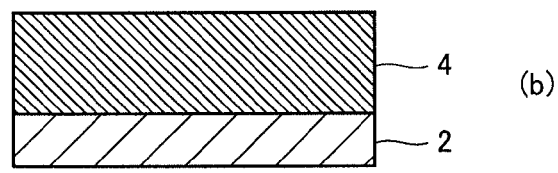
Figure 3:
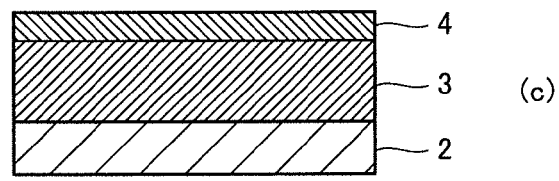
Figure 3:
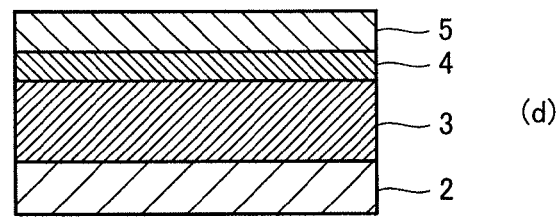
Figure 3:
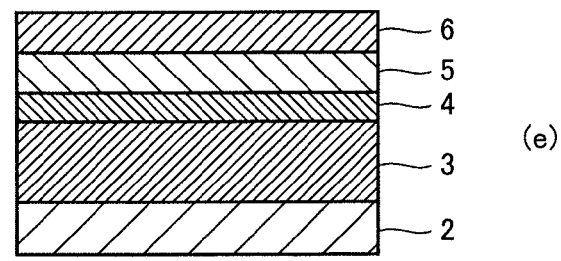

FIG. 3 is a schematic sectional view to describe a method of producing substrate 1 and superconducting wire 7 according to an embodiment of the present invention. Referring to FIG. 3, a method of producing substrate 1 according to an embodiment of the present invention includes the steps of preparing a substrate having formed on Cu layer 2 shown in FIG. 3 (a) an Ni layer 4 through plating, as shown in FIG. 3 (b); alloying a portion of Ni layer 4 while leaving the remaining portion of Ni layer 4, as shown in FIG. 3 (c); and epitaxial-growing an intermediate layer 5 on Ni layer 4, as shown in FIG. 3 (d), after the step of alloying Ni layer 4. Furthermore, the method of producing superconducting wire 7 according to an embodiment of the present invention further includes the step of forming a superconducting layer 6 on intermediate layer 5, as shown in FIG. 3 (e).

(Step of Forming Nickel Layer)

As shown in FIGS. 3 (a) and (b), a substrate is prepared, having Ni layer 4a formed on Cu layer 2 through plating. The plating method includes, for example, an electrolytic nickel plating process carried out on Cu layer 2, for example, in a solution containing nickel chloride, nickel sulfate, or the like.

As shown in FIG. 3 (b), the thickness of Ni layer 4 formed on Cu layer 2 through plating is preferably 1.3 to 3.6 μM, more preferably 1.3 to 3.0 μm. In the case where the thickness is greater than or equal to 1.3 μm, diffusion of all the Ni atoms to Cu layer 2 can be suppressed even if heat of approximately 800-1000° C. is applied in the step of alloying a portion of Ni layer 4 while leaving the remaining portion of Ni layer 4, as will be described afterwards. Accordingly, the function of Ni layer 4, not readily oxidized, and having a favorable matching lattice with intermediate layer 5, can be exhibited effectively. In the case where the thickness is less than or equal to 3.6 μm, the Ni constituting Ni layer 4 will readily diffuse to Cu layer 2 in the alloying step to facilitate alloying effectively.

(Step of Alloying)

As shown in FIG. 3 (c), one portion of Ni layer 4 is alloyed while leaving the remaining portion of Ni layer 4. By this step, Ni constituting Ni layer 4 and Cu constituting Cu layer 2 are alloyed to allow an alloy layer 3 including Cu—Ni alloy to be formed. The magnetism of Cu—Ni alloy is lower than that of simple Ni. Therefore, in the case where superconducting wire 7 is produced using substrate 1 including alloy layer 3, concentration of the magnetic field towards the end region in the width direction of superconducting wire 7 can be alleviated. Accordingly, the magnetic field affecting the current flowing through superconducting wire 7 can be reduced, allowing reduction in AC loss of the superconducting wire.

Furthermore, since a portion including the surface of Ni layer 4 is left, orientation of Ni layer 4 can be maintained.

The step of alloying nickel layer 4 is preferably carried out under reduced pressure, absent of hydrogen gas. For the atmosphere gas, Ar, $N_2$, for example, or the like, can be used. Reduced pressure is of a level lower than the atmospheric pressure, preferably 0.1 to 10 Pa, for example.

The step of alloying nickel layer 4 is preferably carried out by subjecting Ni layer 4 to thermal treatment at the temperature of 800-1000° C. If the temperature is below 800° C., alloying of nickel will not proceed. Sufficient effect in reducing magnetism cannot be achieved. If the temperature exceeds 1000° C., Ni and Cu will be completely diffused to be alloyed, causing diffusion of Cu to the surface of the Ni layer. Since Cu is readily oxidized, the orientation at the surface of Ni layer 4 cannot be improved.

The step of alloying Ni layer 4 is preferably carried out by subjecting the Ni layer to thermal treatment at the temperature of 800 to 1000° C. for 15 to 25 minutes. If the duration of thermal treatment is less than 15 minutes, alloying will not proceed sufficiently. The effect of reducing magnetism cannot be expected. If the duration exceeds 25 minutes, Ni and Cu will be completely diffused to be alloyed, causing diffusion of Cu to the surface of the Ni layer. Since Cu is readily oxidized, the orientation at the surface of Ni layer 4 cannot be improved.

(Step of Epitaxial-Growing Intermediate Layer)

As shown in FIG. 3 (d), intermediate layer 5 is deposited on Ni layer 4 epitaxially to obtain substrate 1. The method of forming a thin film oxide qualified as intermediate layer 5 is not particularly limited as long as the object of the present invention is not impaired. For example, sputtering, EBD (Electron Beam Deposition), PLD (Pulse Laser Deposition), thermal deposition or the like can be adopted. For example, by epitaxial-growing a $CeO_2$ thin film as intermediate layer 5 on biaxial oriented Ni layer 4 having the <100> axis in a direction perpendicular to the substrate face and the <010> axis in the length direction of the substrate after the alloying step, a $CeO_2$ thin film having the <100> axis oriented perpendicular to the substrate face and the <011> axis oriented in the length direction of the substrate is formed. Thus, a $CeO_2$ thin film having high biaxial orientation can be obtained.

In the case where the intermediate layer is formed of a plurality of layers, the orientation can be maintained by depositing the second intermediate layer epitaxially on the first intermediate layer, for example.

Fourth Embodiment

Method of Producing Superconducting Wire

FIG. 3 is a schematic sectional view to describe a method of producing substrate 1 and superconducting wire 7 according to an embodiment of the present invention. Referring to FIG. 3, the method of producing superconducting wire 7 according to an embodiment of the present invention includes the steps of preparing a substrate having formed on Cu layer 2 shown in FIG. 3 (a) an Ni layer 4 through plating, as shown in FIG. 3 (b); alloying a portion of Ni layer 4 while leaving the remaining portion of Ni layer 4, as shown in FIG. 3 (c); epitaxial-growing an intermediate layer 5 on Ni layer 4, as shown in FIG. 3 (d), after the step of alloying Ni layer 4; and forming a superconducting layer 6 on intermediate layer 5, as shown in FIG. 3 (e).

The step of forming a nickel layer, the step of alloying, and the step of epitaxial-growing an intermediate layer are similar to those in the method of producing a substrate.

<Formation of Superconducting Layer>

In the case where superconducting layer 6 is formed on intermediate layer 5 of substrate 1 obtained according to the fourth embodiment, for example, a superconducting layer 6 of high biaxial orientation can be obtained since intermediate layer 5 has favorable orientation.

The method of forming a thin oxide film that will become superconducting layer 6 is not particularly limited as long as the object of the present invention is not impaired. Preferably, the PLD method, MOD (Metal Organic Deposition), MOCVD (Metal Organic Chemical Vapor Deposition), and the like can be adopted.

Furthermore, for the purpose of protecting superconducting layer 6, a protection layer (not shown) can be formed on superconducting layer 6, as necessary. The method of forming a protection layer preferably includes, but not particularly limited to, sputtering, EBD, PLD, thermal deposition, MOD, MOCVD, plating, and the like.

EXAMPLE

Example 1

First, a substrate having a 18 μm-thick Cu layer on a 100 μm-thick SUS substrate was prepared. The substrate including the Cu layer was subjected to electrolytic nickel plating in a solution containing nickel chloride to faun an Ni layer having a thickness of 2.4 μm.

The Ni layer was subjected to thermal treatment for 15 minutes using Ar gas under the atmosphere of 0.1 Pa to 10 Pa in pressure at the thermal treatment temperature of 850° C.-1000° C. Thus, a Cu—Ni alloy layer was formed from the Ni layer and Cu layer.

Immediately thereafter, sputtering was carried out using a mixture of $H_2$ gas and Ar gas as the reducing gas (composition: 3 mole % of $H_2$ gas, 97 mole % of Ar gas) under the atmosphere of 5.2 Pa in pressure and at the substrate temperature of 700° C. to form on the Ni layer a $CeO_2$ thin film to a thickness of 0.15 μm as an intermediate layer. On that $CeO_2$ thin film, a YSZ thin film was formed to a thickness of 0.26 μm as the second intermediate layer under the atmosphere of 2.6 Pa in pressure and at the substrate temperature of 900° C. with the mixture gas modified (composition: 0.5 mole % of $O_2$ gas, 99.5 mole % of Ar gas). Finally, a $CeO_2$ thin film was formed to a thickness of 0.05 μm as the third intermediate layer on the YSZ layer under the atmosphere of 2.6 Pa in pressure and at the substrate temperature of 800° C. with the mixture gas modified (composition: 1 mole % of $O_2$ gas, 99 mole % of Ar gas). Thus, the substrate of Example 1 was obtained.

Then, GdBCO was deposited as the superconducting layer by PLD on the intermediate layer. Thus, the superconducting wire of Example 1 was obtained.

Comparative Example 1

A substrate and a superconducting wire were obtained in a manner similar to those of Example 1 set forth above, provided that the Ni layer was not subjected to thermal treatment.

Comparative Example 2

A substrate and a superconducting wire were obtained in a manner similar to those of Example 1 set forth above, provided that the Ni layer was subjected to thermal treatment for 30 minutes.

(Measurement Method)

For the substrates of Example 1 and Comparative Examples 1 and 2, the thickness of each of the Ni layer, Cu—Ni layer (alloy layer), and Cu layer, as well as the biaxial orientation of the $CeO_2$ thin film were measured. Furthermore, the hysteresis loss was measured for the superconducting wire of Example 1 and Comparative Examples 1 and 2. The results are shown in Table 1 set forth below.

The thickness of each layer in the substrate was measured by EPMA (Electron Probe Micro-Analyzer).

With regard to the c-axis orientation of the $CeO_2$ thin film on the substrate, the X-ray diffraction peak intensity from the (200) plane and (111) plane of the $CeO_2$ thin film (I (200) and I (111)) was measured. The c-axis orientation of the $CeO_2$ thin film was evaluated by the numeric value of (I(200)/(I (200)+I(111)). A higher numeric value implies a higher c-axis orientation of the $CeO_2$ thin film qualified as the intermediate layer, and is preferable. The X-ray diffraction peak intensity from the (200) plane represents the amount of crystals oriented in the direction where the <100> axis is perpendicular to the substrate face. The X-ray diffraction peak intensity from the (111) plane represents the amount of crystals uniaxially oriented in the direction where the <111> axis is perpendicular to the substrate face.

With regard to the hysteresis loss of the superconducting wire, a magnetic field was applied in a direction parallel to the tape face of the superconducting wire at room temperature. The hysteresis loss thereof was measured using a vibrating sample magnetometer (VSM).

(Measurement Results)

TABLE 1

|  |  | Comparative Example 1 | Comparative Example 2 | Example 1 |
|---|---|---|---|---|
| Thermal Treatment Temperature |  | Not Treated | 850–1000° C. | 850–1000° C. |
| Thermal Treatment Duration |  | — | 30 minutes | 15 minutes |
| Substrate Structure After Thermal Treatment | Ni layer | 2.4 μm | 0 μm | 1.3 μm |
|  | Cu-Ni layer | 0 μm | 3 μm | 1.7 μm |
|  | Cu layer | 18 μm | 17.4 μm | 17.5 μm |
|  | SUS layer | 100 μm | 100 μm | 100 μm |
| Hysteresis Loss |  | 53 J/m$^3$ | 0 J/m$^3$ | 15 J/m$^3$ |
| C-axis orientation of $CeO_2$ thin film (I (200)/I (200) + I (111)) × 100) |  | 95% | 50% | 95% |

By subjecting the Ni layer to thermal treatment for 15 minutes as in Example 1, a Cu—Ni alloy layer of 1.7 μm in thickness was formed while leaving an Ni layer of 1.3 μm in thickness. By the results of EPMA analysis, it was confirmed that the Ni concentration in the alloy layer decreased monotonically from the interface between the alloy layer and the nickel layer towards the interface between the alloy layer and the copper layer. The $CeO_2$ thin film had a favorable biaxial orientation since the Cu and Ni were alloyed only partially, and Cu did not diffuse to the surface of the Ni layer. Furthermore, the hysteresis loss could be reduced as compared to Comparative Example 1 not having the Ni layer subjected to thermal treatment.

In Comparative Example 1, Ni and Cu were not alloyed since the Ni layer was not subjected to thermal treatment. Therefore, the hysteresis loss of the superconducting wire was considerable.

In Comparative Example 2, Ni and Cu were completely alloyed by the thermal treatment on the Ni layer carried out for 30 minutes. Therefore, the hysteresis loss of the superconducting wire was reduced. However, since Cu was diffused to the surface of the Ni layer, the biaxial orientation of the $CeO_2$ thin film was degraded as compared to Comparative Example 1 where the Ni layer was not subjected to thermal treatment.

It is to be understood that the embodiments and examples disclosed herein are only by way of example, and not to be taken by way of limitation. The scope of the present invention is not limited by the description above, but rather by the terms of the appended claims, and is intended to include any modifications within the scope and meaning equivalent to the terms of the claims.

REFERENCE SIGNS LIST

1 substrate; 2 copper layer; 3 alloy layer; 4 nickel layer; 5 intermediate layer; 6 superconducting layer; 7 superconducting wire.

The invention claimed is:

1. A substrate comprising:
   a copper layer,
   an alloy layer containing copper and nickel, formed on said copper layer,
   a nickel layer formed on said alloy layer, and
   an intermediate layer formed on said nickel layer,
   wherein a concentration of nickel in said alloy layer at an interface between said alloy layer and said nickel layer is greater than the concentration of nickel in said alloy layer at the interface between said alloy layer and said copper layer, and copper does not diffuse to a surface of said nickel layer.

2. The substrate according to claim 1, wherein the concentration of nickel in said alloy layer decreases monotonically from the interface between said alloy layer and said nickel layer towards the interface between said alloy layer and said copper layer.

3. A method of producing a substrate, comprising the steps of:
   preparing a substrate having a nickel layer formed on a copper layer through plating,
   alloying a portion including a surface of said nickel layer while leaving a remaining portion of said nickel layer, and
   epitaxial-growing an intermediate layer on said nickel layer after the step of alloying said nickel layer.

4. The method of producing a substrate according to claim 3, wherein the step of alloying said nickel layer is carried out under reduced pressure, absent of hydrogen gas.

5. A superconducting wire comprising:
   a copper layer,
   an alloy layer containing copper and nickel, formed on said copper layer,
   a nickel layer formed on said alloy layer,
   an intermediate layer formed on said nickel layer, and
   a superconducting layer formed on said intermediate layer,
   wherein a concentration of nickel in said alloy layer at an interface between said alloy layer and said nickel layer is greater than the concentration of nickel in said alloy layer at the interface between said alloy layer and said copper layer, and cooper does not diffuse to a surface of said nickel layer.

6. The superconducting wire according to claim 5, wherein the concentration of nickel in said alloy layer decreases monotonically from the interface between said alloy layer and said nickel layer towards the interface between said alloy layer and said copper layer.

7. A method of producing a superconducting wire comprising the steps of:
   preparing a substrate having a nickel layer formed on a copper layer through plating,
   alloying a portion including a surface of said nickel layer while leaving a remaining portion of said nickel layer,
   epitaxial-growing an intermediate layer on said nickel layer after said step of alloying said nickel layer, and
   forming a superconducting layer on said intermediate layer.

8. The method of producing a superconducting wire according to claim 7, wherein the step of alloying said nickel layer is carried out under reduced pressure, absent of hydrogen gas.

* * * * *